United States Patent

Armstrong et al.

[11] Patent Number: 6,067,219
[45] Date of Patent: May 23, 2000

[54] POWER CUT-OFF DEVICE

[75] Inventors: Charles Vincent Armstrong, Londonderry, United Kingdom; James Bonner, County Donegal, Ireland

[73] Assignee: N. P. R. Technology Limited, Londonderry, United Kingdom

[21] Appl. No.: 08/809,527
[22] PCT Filed: Sep. 20, 1995
[86] PCT No.: PCT/IE95/00047
    § 371 Date: Jun. 16, 1997
    § 102(e) Date: Jun. 16, 1997
[87] PCT Pub. No.: WO96/10283
    PCT Pub. Date: Apr. 4, 1996

[30] Foreign Application Priority Data

Sep. 27, 1994 [IE] Ireland ................................. 5940773
May 19, 1995 [IE] Ireland ................................. 950365

[51] Int. Cl.⁷ ...................................................... H02H 3/00
[52] U.S. Cl. ................................ 361/101; 361/93; 361/115
[58] Field of Search .............................. 361/93, 94, 98, 361/100, 101, 115

[56] References Cited

U.S. PATENT DOCUMENTS

| | | | |
|---|---|---|---|
| 4,394,703 | 7/1983 | Butcher | 361/101 |
| 4,638,396 | 1/1987 | Mukli et al. | 361/101 |
| 4,721,869 | 1/1988 | Okado | 307/570 |

FOREIGN PATENT DOCUMENTS

| | | | |
|---|---|---|---|
| 0133789 | 7/1984 | European Pat. Off. | H03K 17/08 |
| 4237489A1 | 5/1994 | Germany | H01L 23/62 |

OTHER PUBLICATIONS

International Search Report for International Application No. PCT/IE95/00047; Date of Completion—Dec. 22, 1995; Authorized Officer—R. Salm.

*Primary Examiner*—Stephen W. Jackson
*Attorney, Agent, or Firm*—Curtis L. Harrington

[57] ABSTRACT

A power cut-off device comprises first and second electronic switching devices (FETs T2 and T1) which are cross-coupled so that when one switching device is on the other is off and vice versa, and a load (11) to be protected is connectable in series with the first switching device (FET T2). If the current through the first switching device (FET T2) exceeds a certain value, caused for example by a short circuit at the load, the second switching device (FET T1) is turned on to turn the first switching device off.

6 Claims, 4 Drawing Sheets

POWER CUT-OFF DEVICE

TECHNICAL FIELD

This invention relates to a power cut-off device.

DISCLOSURE OF THE INVENTION

According to the invention there is provided a power cut-off device for protecting a load, the device including a first switching device comprising a field effect transistor having source, drain and gate terminals, and a second switching device having first and second current terminals and a control terminal, wherein the first switching device is cross-coupled to the second switching device with one of the source and drain of the first switching device and one of the first and second current terminals of the second switching device being connected to a common node such that when one switching device is on the other switching device is off and vice versa, and wherein the load is connectable in series with the first switching device such that substantially the entire voltage of the power supply would be applied across the first switching device if the load were short circuited.

DESCRIPTION OF THE PREFERRED EMBODIMENTS

Embodiments of the invention will now be described, by way of example, with reference to the accompanying drawings.

Figure 1:
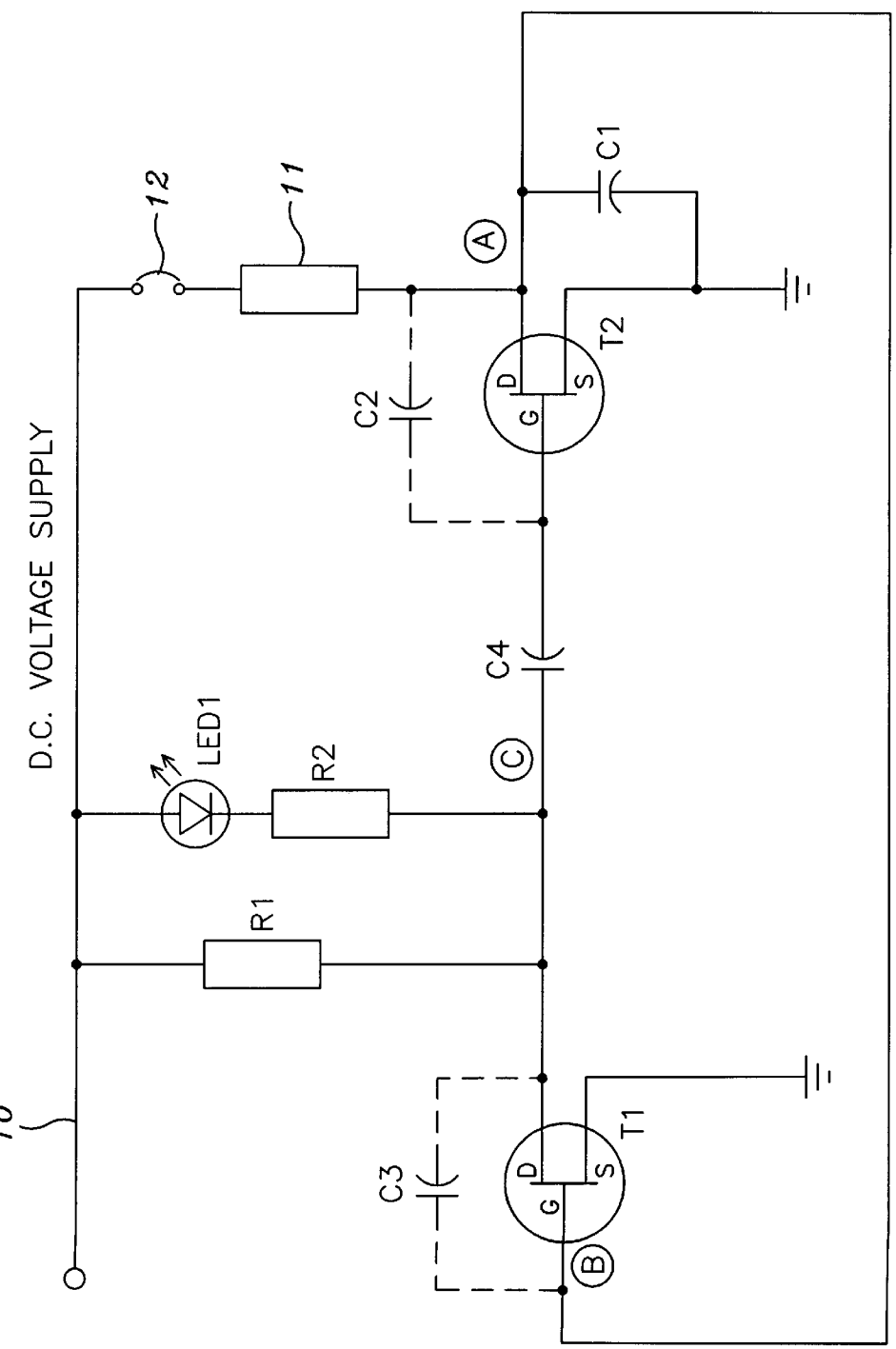
FIG. 1 is a circuit diagram of a DC power cut-off device according to a first embodiment of the invention.

The device according to FIG. 1 comprises a pair of field effect transistors (FETS) T1 and T2 which are cross-coupled so that the drain of each is connected to the gate of the other. FET T1 and FET T2 should have identical electrical characteristics as far as possible. The FET T1 is connected in series with a resistor R1 between a DC voltage supply 10 and ground, and the FET T2 is connected in series with a resistive load 11 to be protected, also between the DC voltage supply 10 and ground.

A capacitor C1 is connected across the source and drain of the FET T2 (at this the point ignore the capacitors C2 and C3) and a fusible link 12 is connected in series with the load 11. A light emitting diode LED 1 and series-connected resistor R2 are connected in parallel with the resistor R1.

In this embodiment the DC voltage supply 10 is 12 volts and the components have the following values:

R1: 420 ohms
R2: 400 ohms
C1: 100 nanofarads
FETs T1 and T2: Beta=0.42

When power is switched on the FET T2 is turned on by the DC voltage applied to the gate of FET T2 via the resistor R1. A capacitor C4 in series with the gate of FET T2 speeds up the operation of the device and ensures that FET T2 turns on while FET T1 remains off. As a result, a small current flows through the RC network comprising capacitor C1 and resistive load 11 at a rate determined by the resistance of the load 11 and the value of the capacitor C1. This causes the voltage to fall at the point A which holds the point B (the gate of FET T1) low. Thus FET T1 is held off and the point C (the gate of FET T2) is high to hold on FET T2 so that the supply 10 is applied to the load 11. This is the normal operating condition of the device, wherein the point A remains low, and thereby holds off the FET T1, all the while the FET T2 is on.

When a short circuit is applied across the resistive load 11 to simulate a fault condition, the point A rises substantially to the voltage of the DC supply 10 at a rate determined by the charge time of the capacitor C1, so that substantially the entire 10 volt supply is placed across the source and drain of the FET T2. Concurrently the current flowing through the FET T2 will increase. However, the 10 volt supply voltage across FET T2 drives the latter into saturation, so that the current through FET T2 is limited to the constant saturation current. The saturation current depends upon the power rating of the FET T2 (essentially its physical size) and its value of Beta. In the present case it is assumed that the saturation current is 5 amps.

Although the maximum current flowing through FET T2 is limited to the saturation current in the case of a fault, this situation cannot be permitted to persist. However, when the point A goes high so will the point B. This switches on the FET T1 so that the point C is pulled low which in turn switches off the FET T2 to remove power from the load 11.

A small current now flows from the DC supply 10 to ground via the FET T1 just sufficient to keep the FET T1 on, the part of this current flowing through the resistor R2 and the LED 1 being just sufficient to illuminate the LED 1 to provide an indication that a short has occurred. The value of the resistor R1 should be selected so that it can effectively switch on the FET T1 with as little power consumption as possible.

When a fault has occurred the power is switched off and the fault fixed, after which the power is switched on again to resume the normal operating condition as described above. The LED 1 and associated resistor R2 may be omitted if it is not desired to provide a visual indication of a fault.

The capacitor C1 is responsible for the device's cut-off delay, and should be chosen so as to filter out switching transients and allow for the inrush of current in motors, lamps, heaters, etc.

As mentioned above, the saturation current of the FET T2 is dependent in part upon the beta of the FET T2. The beta of FET T2 has to be carefully chosen. If it is too high the resistance of the FET T2 in the ON state during normal operation will cause undue heat dissipation which may harm the device in the long term and in any event is inefficient. On the other hand, if the beta is too low the saturation current will be too high which may cause the device to blow. We have found that a beta in the range 0.42–0.48 is a compromise between these two extremes and provides satisfactory performance. We have also found that a beta below 0.37 or above 0.55 is unsatisfactory. Although the switching time of the device may be adjusted by selecting different values for the capacitor C1, the speed is ultimately limited by the operating speed of the field effect transistors FET T1 and PET T2, which is typically 15 ns. However, a further increase in speed may be achieved by connecting additional capacitors C2 and C3 respectively across the drain-gate path of each FET. Also, by selecting different values for C2 and C3 one can provide different speeds for switching the device on and switching it off.

The fusible link 12 is connected in series with the load 11 as a fail-safe feature. If a fault occurs in the device the load is still protected by the fusible link. The link 12 is designed to blow at a current slightly higher than the cut-off current of the device.

Figure 2:
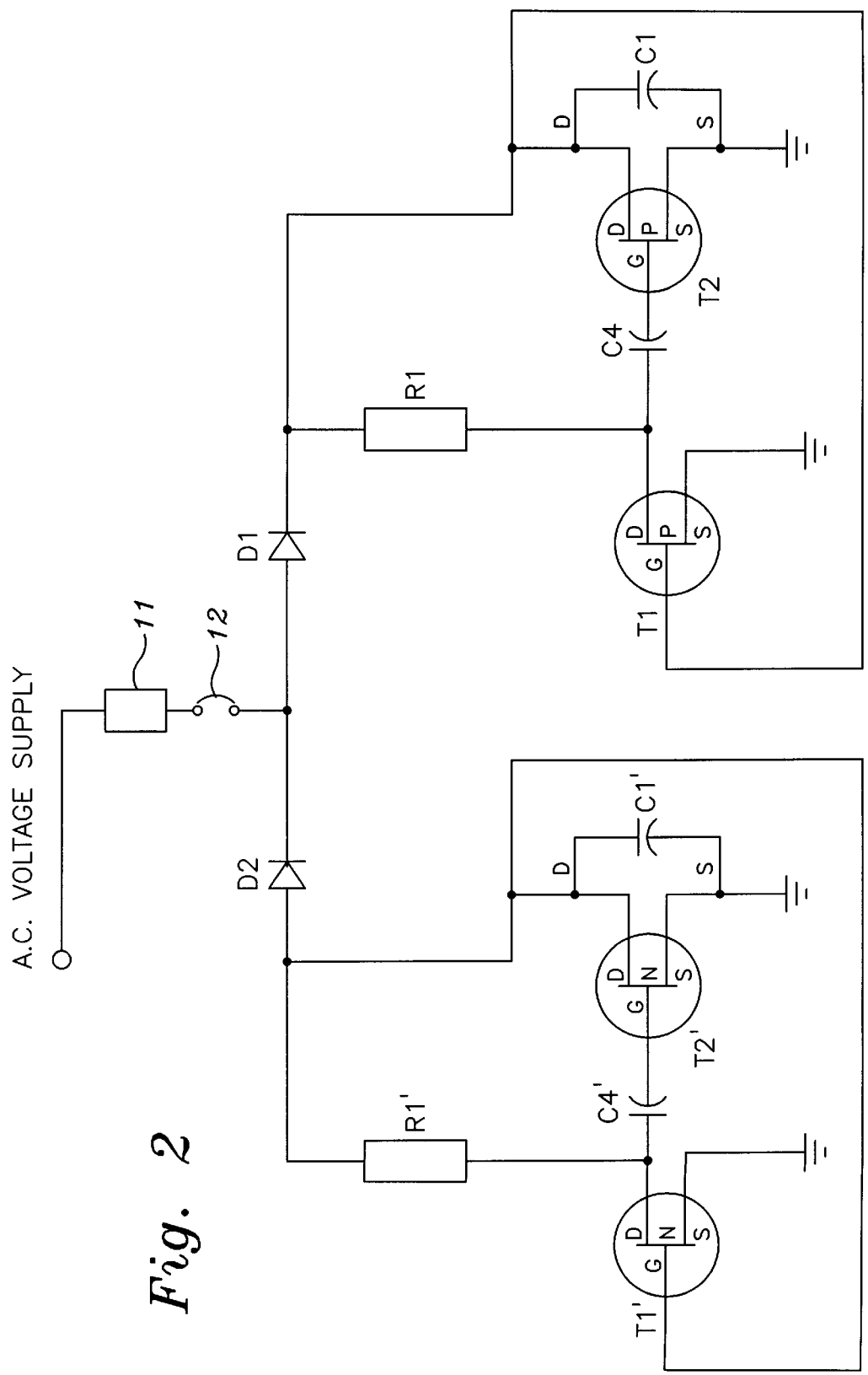
FIG. 2 is a circuit diagram of an AC power cut-off device according to a second embodiment of the invention.

Referring now to FIG. 2, the AC power cut-off device essentially comprises two sub-circuits similar to the circuit described above for the DC case (except that the load 11 is connected in series with both FETs T1 and T2 rather than just the FET T2), and in FIG. 2 the same or similar components have been given the same reference numerals as in FIG. 1. One sub-circuit consists of the cross-coupled FETs T1 and T2 and is responsive to positive half cycles of the AC voltage and the other sub-circuit consists of the cross-coupled FETs T1' and T2' and is responsive to the negative half cycles, as determined by diodes D1 and D2.

During positive half cycles the sub-circuit comprising FETs T1 and T2 operates substantially as described above for the DC case, the FET T2 being on and the FET T1 being off during normal operation. When there is a fault, the FET T2 turns off and the FET T1 turns on. During the negative half cycles both FETs T1 and T2 are off. In this embodiment the resistor R1 has a large value to limit the current flowing through FET T1 when the latter is on.

Similarly, in the sub-circuit comprising FETs T1' and T2', during negative half cycles the FET T2' is on and the FET T1' is off during normal operation and when there is a fault, the FET T2' turns off and the FET T1' turns on. During the positive half cycles both FETs T1' and T2' are off. In this embodiment it is necessary that the FETs T1 and T2 be of complementary type to the FETs T1' and T2'. Hence, in this case the FETs T1 and T2 are p-channel devices whereas the FETs T1' and T2' are n-channel devices.

As in the DC embodiment, it is possible to modify the characteristics of the circuit by adding capacitors equivalent to those indicated at C2 and C3 in FIG. 1 across the drain-gate paths of each of the FETs in each of the two sub-circuits of FIG. 2. Also, analogous to FIG. 1, a respective resistor R2 and LED 1 may be connected in parallel with each of the resistors R1 and R1' to provide a visual indication of a fault.

Figure 3:
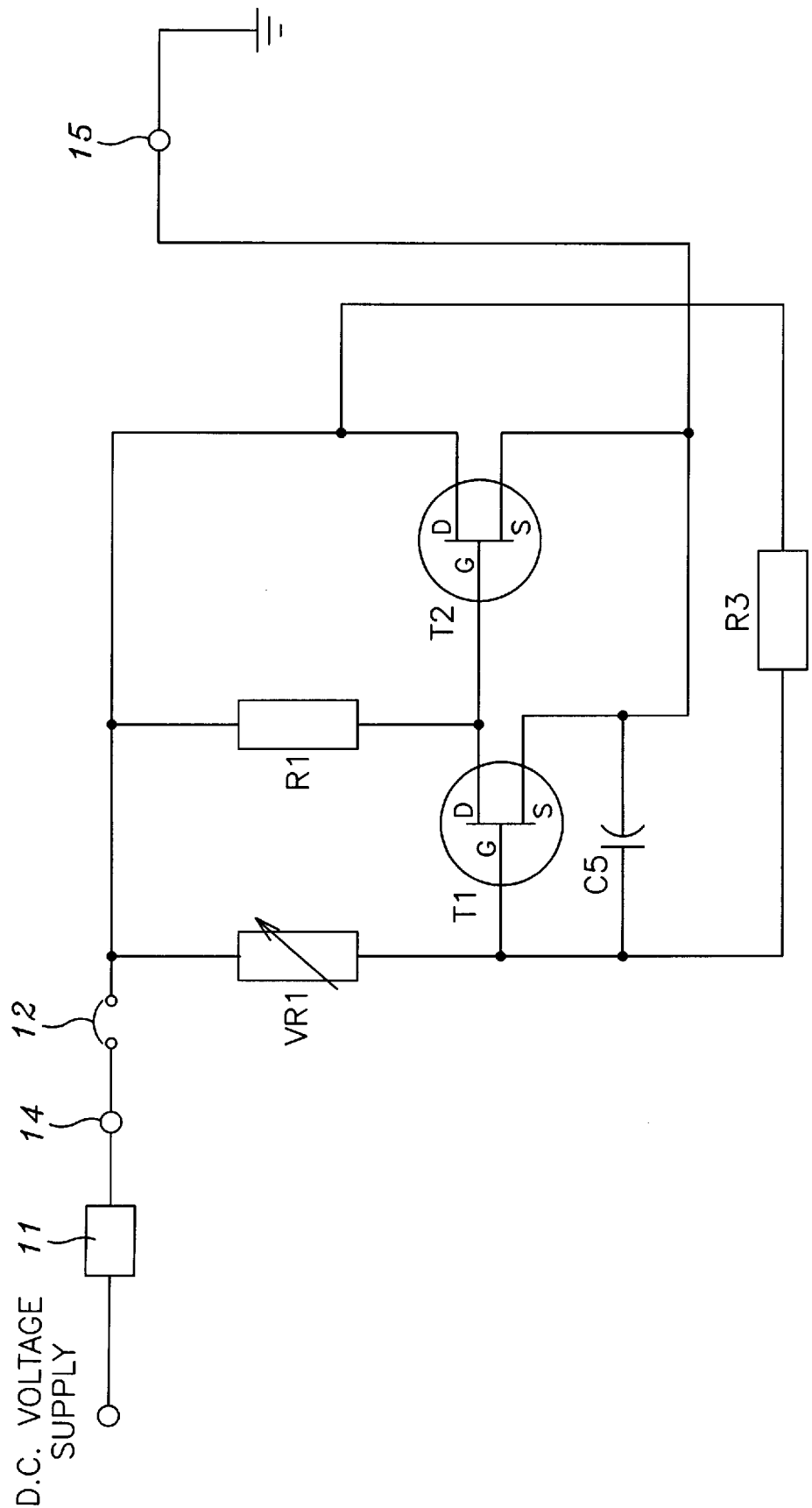
FIG. 3 is a circuit diagram of a DC power cut-off device according to a third embodiment of the invention.

FIG. 3 shows a further embodiment of a DC power cut-off device which uses only two input/output pins rather than three as for FIG. 1. These are the pins shown at 14 and 15 by which the device is connected in series with the load 11 between the D.C. voltage supply and ground. It will be noted that the device of FIG. 3 is very similar to one half of the device of FIG. 2, in that the load 11 is connected in series with both FETs T1 and T2.

The device of FIG. 3 again comprises a pair of field effect transistors T1 and T2 which are cross-coupled so that the drain of each is connected to the gate of the other. The load 11 is connected directly to the drain of the FET T2 and via a variable resistor VR1 to the gate of the FET T1, and it is also connected via a large resistor R1 to the line connecting the drain of FET T1 to the gate of FET T2.

The RC time constant at the FET T2 is shorter than that at the FET T1 (because of the capacitor C5 connected across the gate-drain path of the FET T1) so that when power is switched on the FET T2 switches on before the FET T1. Thus the drain of the FET T2 goes low which pulls the gate of the FET T1 low via the resistor R3 to prevent the FET T1 from turning on. This is the normal operating condition of the device, with the FET T2 turned on so as to complete a path to ground for current through the load 11 while the FET T1 is held off. In the case of a fault condition such as a short circuit in the load 11 the voltage at the drain of the FET T2 rises and, when it reaches the threshold voltage of the FET T1 (as established by the value of VR1), the FET T1 turns on. The drain of the FET T1 then goes low and, because the drain of the FET T1 is connected to the gate of the FET T2, the FET T2 is turned off. The RC time constant of the capacitor C5 and resistor R3 is selected to provide an appropriate turn on time for the FET T1 so that switching transients and the like do not inadvertently trigger the device.

In the embodiment of FIG. 3 the turn on time of the FET T2 is given by:

$$(1.1) \times R1 \times C6$$

where R1=10 Kohms and C6=0.0000001 uF being the capacitance of the gate oxide layer of FET T2, and the cut off time of the device in the case of a fault current is given by:

$$(1.1) \times (VR1/R3) \times C5$$

where R3=30 Kohms and C5=1 uF.

As before, it is possible to modify the characteristics of the circuit by adding capacitors equivalent to those indicated at C2 and C3 in FIG. 1 across the source-gate paths of each of the FETs T1 and T2. Also, a resistor R2 and LED 1 may be connected in parallel with the resistor R1 to provide a visual indication of a fault.

Figure 4:
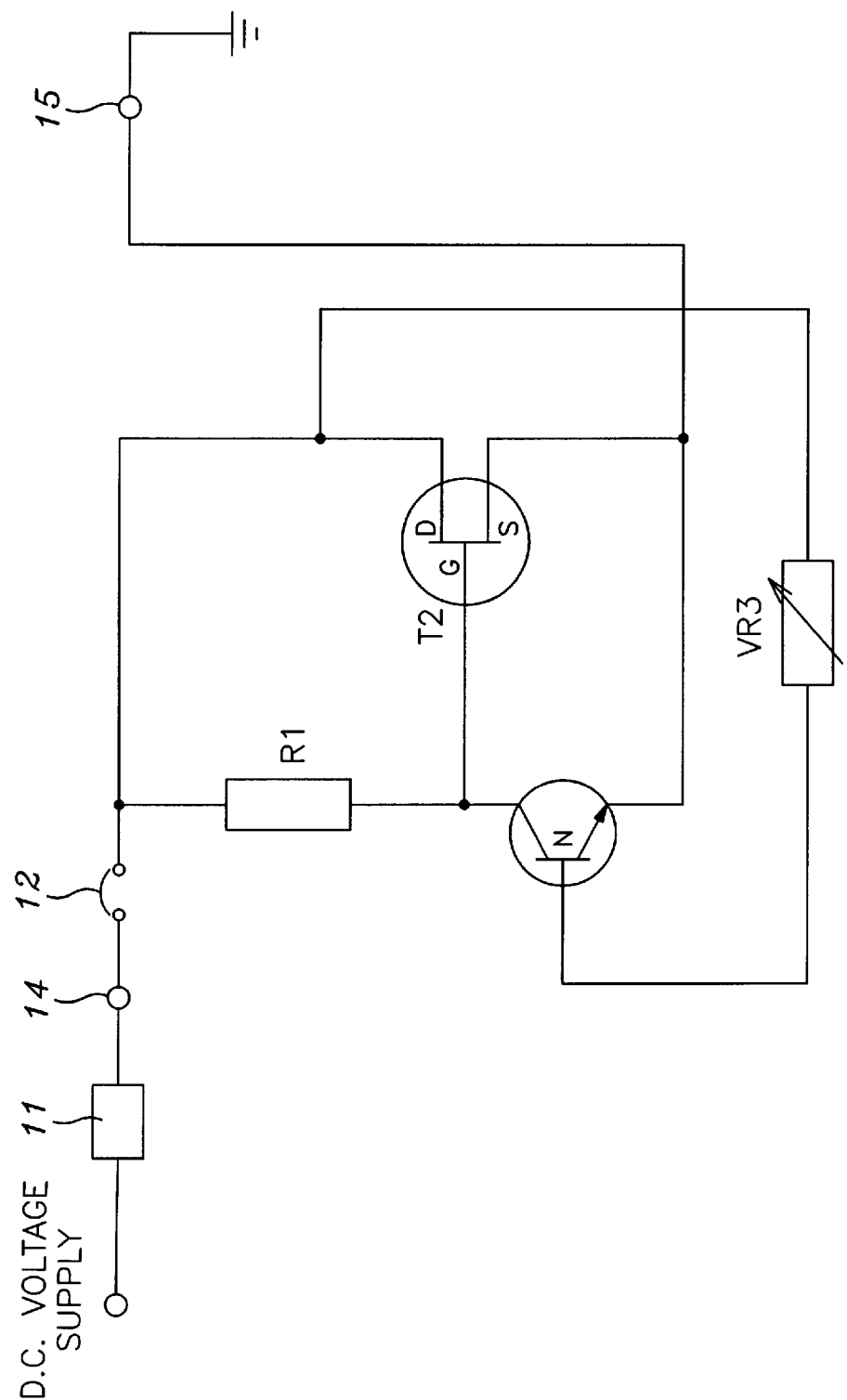
FIG. 4 is a circuit diagram of a DC power cut-off device according to a fourth embodiment of the invention.

A fourth embodiment of the invention (FIG. 4) is similar to the circuit shown in FIG. 3 except that (a) the FET T1 is replaced by a bipolar NPN transistor N, (b) the variable resistance VR1 is omitted, (c) the capacitor C5 is omitted, and (d) the resistor R3 is replaced by a variable resistor VR3. However, the circuit operates in substantially the same manner as FIG. 3 except that the threshold of the transistor N is determined by the value of VR3.

In all embodiments a zener diode and a resistor can be applied across the DC or AC supply so that the device can be used as an over-voltage protector that can occur in spike voltages or in fault conditions.

The field effect transistors used in the above circuits may be JFETs, MOSFETs, NMOSFETs, DMOSFETS or any other kind. The circuits can be fabricated on silicon or gallium arsenide wafers using semiconductor technology or as hybrids. It is also possible to use FETs with a silicon carbide substrate to withstand the high operating voltage, current and temperature conditions of the device.

What is claimed is:

1. A power cut-off device for protecting a load, the device including a first switching device comprising a field effect transistor having source, drain and gate terminals, and a second switching device having first and second current terminals and a control terminal, wherein the first switching device is cross-coupled to the second switching device with one of the source and drain of the first switching device and one of the first and second current terminals of the second switching device being connected to a common node such that when one switching device is on the other switching device is off and vice versa, and wherein the load is connectable in series with the first switching device such that substantially the entire voltage of the power supply would be applied across the first switching device if the load were short circuited wherein an impedance is connected in series with the second switching device through which current flows when the second switching device is turned on and wherein the load is also connected in series with the impedance.

2. The power cut-off device of claim 1, wherein a device is connected in series with the second switching device to provide a visual indication.

3. The power cutoff device of claim 1, further including a capacitor arranged to delay the turning on of the second switching device to prevent the device triggering in response to switching transients and the like.

4. The power cut-off device of claim 1, wherein the first switching device goes into saturation when the supply voltage is placed across the first switching device so that current through the first switching device is limited to the saturation current of the first switching device.

5. The power cut-off device of claim 4, wherein the first switching device has a beta of from 0.42 to 0.48.

6. A power cut-off device for protecting a load, the device comprising: a first switching device comprising a field effect transistor having a source terminal, a drain terminal and a gate terminal; a second switching device having first and second switched terminals and a control terminal, wherein the drain of the first switching device is coupled to the control terminal of the second switching device, the first switched terminal of the second switching device is coupled to the gate of first switching device and the source of the first switching device and the second switched terminal of the second switching device are coupled in common; and wherein the first switching device is coupleable in series with the load wherein an impedance is connected in series with the second switching device through which current flows when the second switching device is turned on wherein the load is also connected in series with the impedance.

* * * * *